(12) United States Patent
Schiebel

(10) Patent No.: US 6,683,688 B1
(45) Date of Patent: Jan. 27, 2004

(54) METHOD AND DEVICE FOR GAUGING A DEVICE FOR PRODUCING ELECTRICAL COMPONENTS

(75) Inventor: Günter Schiebel, München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/381,420

(22) PCT Filed: Mar. 19, 1998

(86) PCT No.: PCT/DE98/00816

§ 371 (c)(1),
(2), (4) Date: Dec. 6, 1999

(87) PCT Pub. No.: WO98/42171

PCT Pub. Date: Sep. 24, 1998

(30) Foreign Application Priority Data

Mar. 19, 1997 (DE) .......................................... 197 11 476

(51) Int. Cl.[7] ............................................... G01B 11/00
(52) U.S. Cl. ....................................... 356/399; 356/401
(58) Field of Search .................................. 396/399–401

(56) References Cited

U.S. PATENT DOCUMENTS 5,674,650 A * 10/1997 Dirksen et al. ............. 356/401

* cited by examiner

Primary Examiner—Frank G. Font
Assistant Examiner—Phil Natividad
(74) Attorney, Agent, or Firm—Harness, Dickey & Pierce, P.L.C.

(57) ABSTRACT

A test plate (1) is equipped with simulations (3) of components in an automatic equipping unit. The simulations comprise defined markings (4). The test plate is provided with local reference marks (5) having high positional precision in the proximity of the markings (4). A printed circuit board camera of the automatic equipping unit serving as topically resolving sensor is successively moved over the markings (4) and reference marks (5). A marking (4) and a reference mark (5) thereby respectively lie in the scan field (6) of the camera.

Figure 1:
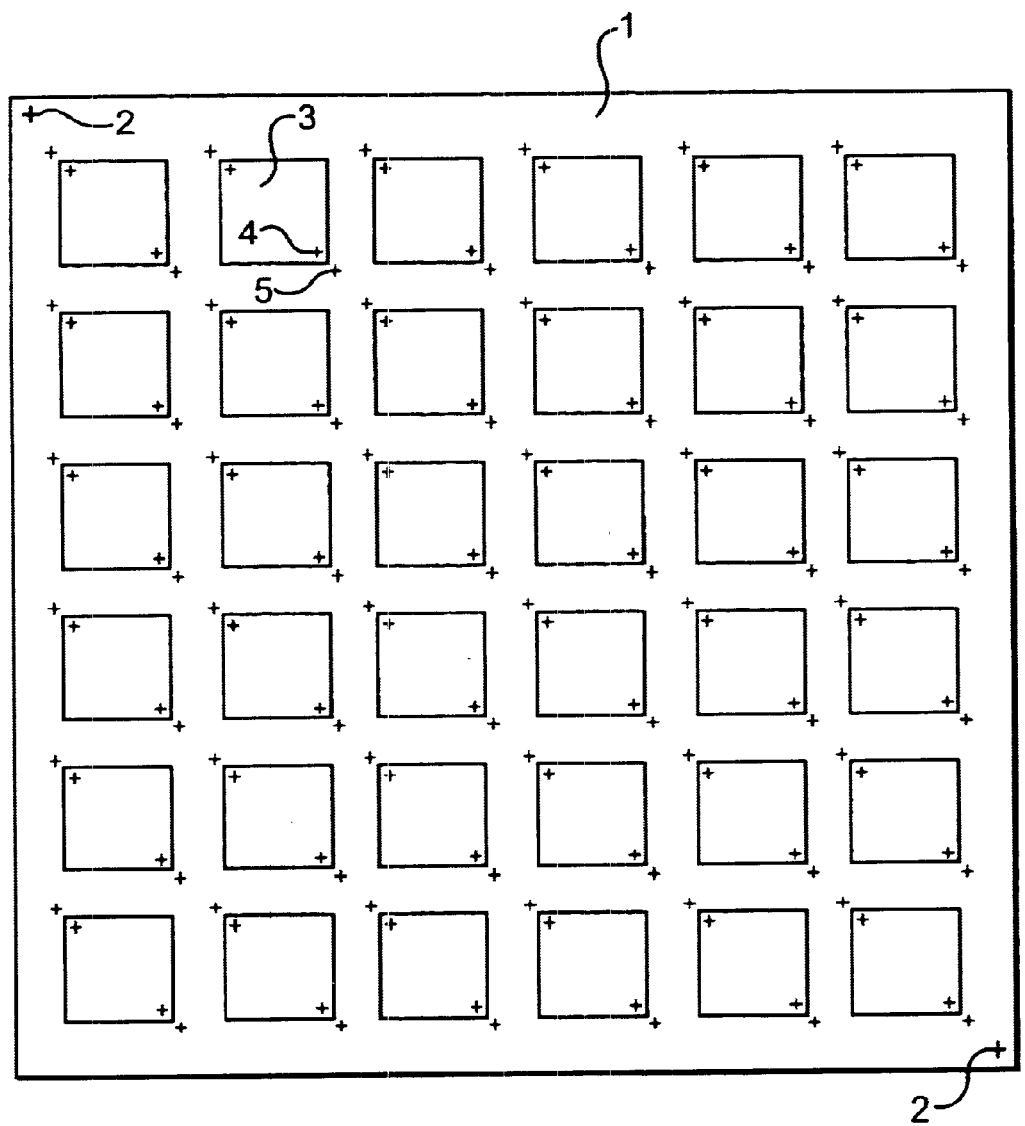

As a result thereof, it is possible to acquire the relative position of the marking (4) relative to the reference mark (5) without thereby having to move the camera, the measuring outlay being reduced as a result thereof.

18 Claims, 2 Drawing Sheets

METHOD AND DEVICE FOR GAUGING A DEVICE FOR PRODUCING ELECTRICAL COMPONENTS

The invention is directed to a method for measuring a means for manufacturing electrical assemblies, particularly for coordinate-related equipping of printed circuit boards with components, whereby a test plate having the nature of a printed circuit board is equipped with wafer-like simulations of the components at defined placement points by the means.

It was previously standard to employ a glass panel similar to a printed circuit board as test plate, this comprising centering marks in its corner regions. The glass panel provided with a two-sided adhesive foil is inserted into the means fashioned, for example, as automatic equipping unit, whereupon the position of the centering marks is identified with a topically resolving printed circuit board camera of the automatic equipping unit. The test plate is then equipped with simulations of components at locations defined relative to the center marks.

In a following method step, the equipped glass panel is inserted into an optical measuring machine. The glass laminae comprised defined markings whose position relative to the centering marks of the glass plate are identified in the measuring machine. Correction values are determined from the positional deviations from the desired ideal position in the coordinate directions and in view of the rotated attitude, these correction values being input as correction parameters into the automatic equipping unit that takes these deviations into consideration during later equipping of printed circuit boards with components.

The invention is based on the object of simplifying and speeding up the determination of the correction parameters.

This object is achieved by the invention according to claims 1 and 6.

A pre-condition is thereby that the local reference marks are applied on the test plate with high precision. Such a precision can be achieved, for example, with the assistance of photolithographic processes. It is possible to forego a marking in the simulations and to instead employ, for example, the outside edges of the simulations as defined structure features. In such cases, it is advantageous to employ appropriate ceramic or metal parts instead of the glass laminae, the edges thereof being easily recognizable.

The critical advantage of the method is comprised therein that it is now no longer the global position of the simulations that is measured relative to the global reference marks of the test plate; rather, only narrow excerpts are observed and measured. A high-precision measuring machine is not required for such measuring procedures. The slight distances between the structure features and the local markings make it possible, given slight measuring errors to identify the positional deviations of the simulations with, for example, the assistance of simple optical measuring devices.

Advantageous developments of the invention are identified in the following claims:

As a result of the features of claim 2, the relative position of the reference marks relative to the structure features of the simulations can be identified at one go without having to move the sensor. Measuring imprecisions are thus only dependent on the quality of the sensor optics. All other machine influences are thus completely suppressed. The sensor fashioned, for example, as CCD camera is connected to an evaluation electronics wherein the relative position of the structure features to the reference marks is calculated.

Due to the development according to claim 3, the test plate—in one clamping—can be equipped with the simulations and can also be measured without additional manipulation, for example with the assistance of the printed circuit board camera. The errors that occur in the centering of the measuring plate are thus eliminated. The equipping of the test plate and the displacement of the printed circuit board camera can be implemented with the assistance of one and the same control device.

After the positional identification has been implemented for all simulations put in place, the systematic deviations are calculated in an evaluation means. This evaluation means can, for example, be a program module incorporated into the control device of the means that communicates the calculated correction parameters, for example, according to claim 4, to the machine control as fixed values without further action.

A particular advantage of such a method is comprised therein that such calibration events can be implemented not only at newly fabricated machines but also at machines already in use, being implemented from time to time without particular outlay and without further auxiliary means, for example, given routine maintenance measures. Modification of the positioning procedures that are caused by wear or aging can thus be checked an corrected with little outlay.

Due to the high speed when measuring the markings, it is possible to employ a high plurality of simulations according to claim 5, so that an adequate plurality of measurements can be implemented for statistical interpretation.

The development according to claim 7 makes it possible to determine the angular position of the simulations in that, for example according to claim 8, the corner regions lying diagonally opposite one another and at a great distance from one another are measured.

As a result of the development according to claim 9, the structure features are length the same optical properties and the reference marks. As a result thereof, the scanning optics can be optimally set since the same distinguishing criteria apply when evaluating the markings as apply when evaluating the reference marks, this facilitating the interpretation.

The simulations according to claim 10 exhibit a good shape stability even at different temperatures. Due to the arrangement of the markings, these and the reference marks lie at the same level, as a result whereof parallax errors are avoided.

The development according to claim 11 makes it possible to also employ non-transparent ceramic material for the simulations instead of transparent material, whereby the markings are then arranged on the upper side.

Figure 2:
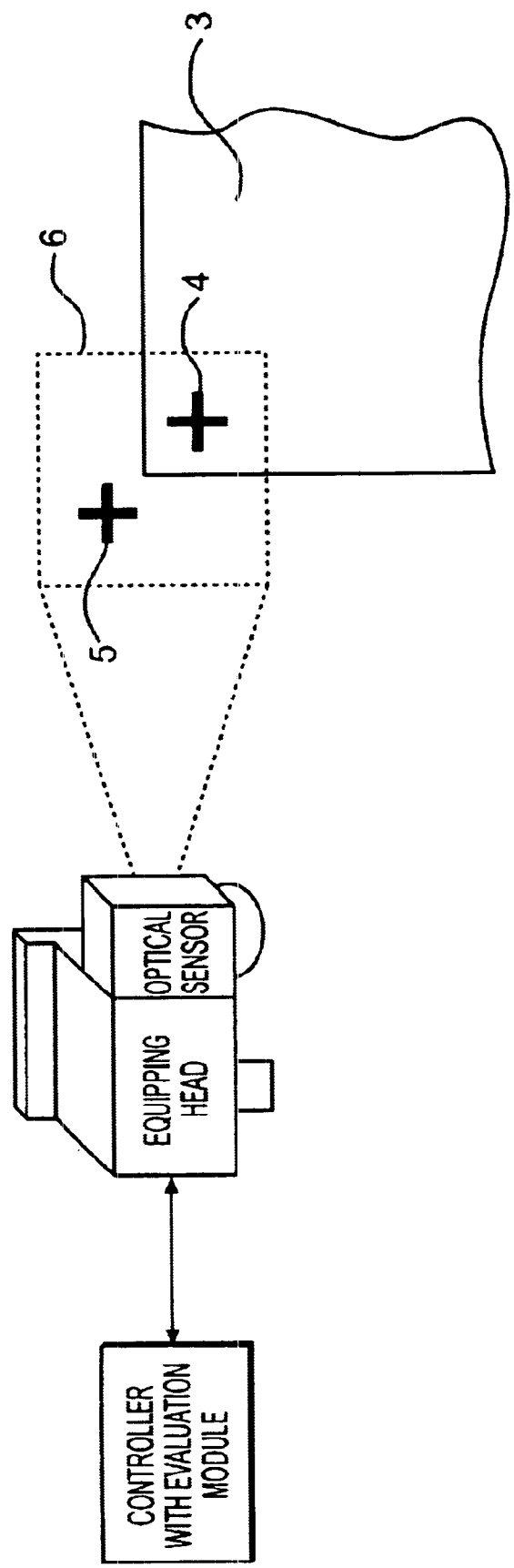

The invention is explained in greater detail below with reference to an exemplary embodiment shown in the drawing. Shown are:

FIG. 1 shows a plan view onto a test plate with simulations of components put in place thereon;

FIG. 2 an enlarged excerpt from the test plate according to FIG. 1.

According to FIGS. 1 and 2, a test plate I composed of a glass pane comprises global centering marks 2 in two comers lying diagonally opposite one another. The test plate 1 is equipped with simulations 3 of electrical components at defined locations in an automatic equipping unit for such components, whereby the centering marks 2 serve the purpose of positional centering of the simulations 3 in the automatic equipping unit.

The simulations 3 are composed of small glass laminae that respectively comprise markings 4 in the fashion of reticules in two comers lying diagonally opposite one another. The test plate 1 is provided with local reference marks 5 at these locations in close proximity to the markings 4, these local reference marks 5 being applied with high positional precision.

The markings 4 and the reference marks 5 are in such close proximity that they fit into a sensing field 6 of a topically resolving, optical sensor that is secured to an equipping head for the components. This equipping head is movable such that the sensor can be positioned over all marked corner regions.

The topically resolving sensor is connected to an evaluation electronics that is in the position to determine the relative position of the markings 4 relative to the respective reference mark 5 without having to thereby move the sensor. A controlled device (not shown) of the automatic equipping means comprises an evaluation module that processes the individual deviations of the markings 4 from the reference marks 5 to form correction parameters for the machine. These correction parameters are automatically accepted by the control device.

What is claimed is:

1. A method for gauging a device for equipping printed circuit boards with components, comprising:
   equipping a test plate with component simulations of the components at defined placement points;
   determining a position of the simulations relative to the reference marks of the test plate using an optical sensor on the basis of positionally defined, optical structure features of the simulations;
   calculating at least one correction parameter for a control device of the device for equipping printed circuit boards from deviations of the position of the structural features from a reference position, wherein the reference marks are locally applied to the placement points of the simulations; and
   identifying the position of the structural features relative to the local reference marks respectively allocated to them, wherein the distance between the reference marks and the structure features of the simulations is less than the width of a scan field of the optical sensor, wherein the optical sensor is successively moved over the reference marks and the structure features, wherein the optical sensor registers images of the locations that respectively contain both the reference mark and the structure feature, wherein the relative position of the respective structure feature and the reference mark relative to one another is determined by evaluating the registered images, wherein the optical sensor is part of the device for equipping printed circuit boards and wherein the evaluation of the images and the calculation of the correction parameter is done in conjunction with an optical evaluation device of the device equipping print circuit boards.

2. The method according to claim 1, wherein the correction parameter determined is automatically communicated to the control device and is stored by the control device.

3. The method according to claim 2, wherein the test plate is equipped with a plurality of simulations continuously there over in close proximity; and wherein the position of all simulations is identified.

4. The method according to claim 1, wherein the reference marks are arranged at the corners of the simulations fashioned as rectangular wafers.

5. The method according to claim 1, wherein the optical structure features of the simulations are fashioned as markings similar to the reference marks.

6. The method according claim 1, wherein the simulations are composed of mineral, transparent material; and wherein the markings are applied on that side of the simulations facing toward the test plate.

7. The method according to claim 1, wherein the reference marks are arranged on the test plate outside of the simulations.

8. An apparatus for equipping printed circuit boards with components, comprising:
   means for equipping a test plate with simulations of the components as defined placement points;
   means for determining the position of the simulations relative to reference marks of the test plate on the basis of positionally defined, optical structure features of the simulations identifiable with an optical sensor, which is included in the means for equipping; and
   means for calculating at least one correction parameter for a control device of the apparatus from identified deviations of the position of the structure features from a reference position, wherein the local reference marks at the placement points of the simulations are applied in the immediate proximity of the optical structure features of the simulations and wherein the distance between the reference marks and the optical structure features of the simulations is less than the width of a scan field of the optical sensor.

9. The apparatus according to claim 8, wherein an additional reference mark is respectively applied at the placement points and is allocated to additional structure features of the simulations; and wherein the additional reference marks and structure features are acquirable by the sensor.

10. The apparatus according to claim 8, wherein the reference marks are arranged at the corners of the simulations fashioned as rectangular wafers.

11. The apparatus according to claim 8, wherein the optical structure features of the simulations are fashioned as markings similar to the reference marks.

12. The apparatus according claim 10, wherein the simulations are composed of mineral, transparent material; and wherein the markings are applied on that side of the simulations facing toward the test plate.

13. The apparatus according to claim 8, wherein the reference marks are arranged on the test plate outside of the simulations.

14. The apparatus according to claim 9, wherein the reference marks are arranged at the corners of the simulations fashioned as rectangular wafers.

15. The apparatus according to claim 9, wherein the optical structure features of the simulations are fashioned as markings similar to the reference marks.

16. The apparatus according to claim 10, wherein the optical structure features of the simulations are fashioned as markings similar to the reference marks.

17. The apparatus according to claim 9, wherein the reference marks are arranged on the test plate outside of the simulations.

18. The method according to claim 10, wherein the reference marks are arranged at the corners of the simulations fashioned as rectangular wafers.

* * * * *